US011269027B2

(12) United States Patent
Mohseni et al.

(10) Patent No.: US 11,269,027 B2
(45) Date of Patent: Mar. 8, 2022

(54) COMPACT OPTICALLY PUMPED MAGNETOMETERS WITH PUMP AND PROBE CONFIGURATION AND SYSTEMS AND METHODS

(71) Applicant: HI LLC, Los Angeles, CA (US)

(72) Inventors: Hooman Mohseni, Wilmette, IL (US); Ethan Pratt, Santa Clara, CA (US); Ricardo Jiménez-Martínez, Culver City, CA (US); Micah Ledbetter, Sunnyvale, CA (US)

(73) Assignee: HI LLC, Los Angeles, CA (US)

( * ) Notice: Subject to any disclaimer, the term of this patent is extended or adjusted under 35 U.S.C. 154(b) by 36 days.

(21) Appl. No.: 16/850,444

(22) Filed: Apr. 16, 2020

(65) Prior Publication Data

US 2020/0341081 A1    Oct. 29, 2020

Related U.S. Application Data

(60) Provisional application No. 62/860,001, filed on Jun. 11, 2019, provisional application No. 62/837,587, filed on Apr. 23, 2019.

(51) Int. Cl.
*G01R 33/26* (2006.01)

(52) U.S. Cl.
CPC .................... *G01R 33/26* (2013.01)

(58) Field of Classification Search
CPC .. G01R 33/26; G01R 33/0094; G01R 33/032; A61B 5/245; G01N 24/006
See application file for complete search history.

(56) References Cited

U.S. PATENT DOCUMENTS

| 3,173,082 A | 3/1965 | Bell et al. |
| 3,257,608 A | 6/1966 | Bell et al. |
| 3,495,161 A | 2/1970 | Bell |

(Continued)

FOREIGN PATENT DOCUMENTS

| CN | 104730484 | 6/2015 |
| CN | 107562188 | 1/2018 |

(Continued)

OTHER PUBLICATIONS

Hill RM, Boto E, Holmes N, et al. A tool for functional brain imaging with lifespan compliance [published correction appears in Nat Commun. Dec. 4, 2019;10(1):5628]. Nat Commun. 2019;10(1):4785. Published Nov. 5, 2019. doi:10.1038/s41467-019-12486-x.

(Continued)

*Primary Examiner* — Jay Patidar
(74) *Attorney, Agent, or Firm* — Branch Partners PLLC; Bruce E. Black

(57) ABSTRACT

An optically pumped magnetometer includes a vapor cell; at least one light source configured to produce a pump light beam and a probe light beam; a lens disposed between the at least one light source and the vapor cell; a quarter wave plate disposed between the lens and the vapor cell; a mirror configured to receive the pump light beam and probe light beam after passing through the vapor cell and reflect the pump light beam and probe light beam back through the vapor cell, the quarter wave plate, and the lens; and at least one detector configured to receive the probe light beam reflected by the mirror.

20 Claims, 6 Drawing Sheets

(56) References Cited

U.S. PATENT DOCUMENTS

| | | |
|---|---|---|
| 3,501,689 A | 3/1970 | Robbiano |
| 3,513,381 A | 5/1970 | Happer, Jr. |
| 4,193,029 A | 3/1980 | Cioccio et al. |
| 4,951,674 A | 8/1990 | Zanakis et al. |
| 5,189,368 A | 2/1993 | Chase |
| 5,192,921 A | 3/1993 | Chantry et al. |
| 5,225,778 A | 7/1993 | Chaillout et al. |
| 5,254,947 A | 10/1993 | Chaillout et al. |
| 5,309,095 A | 5/1994 | Ahonen et al. |
| 5,442,289 A | 8/1995 | Dilorio et al. |
| 5,444,372 A | 8/1995 | Wikswo, Jr. et al. |
| 5,471,985 A | 12/1995 | Warden |
| 5,506,200 A | 4/1996 | Hirschkoff et al. |
| 5,526,811 A | 6/1996 | Lypchuk |
| 5,713,354 A | 2/1998 | Warden |
| 6,144,872 A | 11/2000 | Graetz |
| 6,339,328 B1 | 1/2002 | Keene et al. |
| 6,472,869 B1 | 10/2002 | Upschulte et al. |
| 6,665,553 B2 | 12/2003 | Kandori et al. |
| 6,806,784 B2 | 10/2004 | Hollberg et al. |
| 6,831,522 B2 | 12/2004 | Kitching et al. |
| 7,038,450 B2 | 5/2006 | Romalis et al. |
| 7,102,451 B2 | 9/2006 | Happer et al. |
| 7,145,333 B2 | 12/2006 | Romalis et al. |
| 7,521,928 B2 | 4/2009 | Romalis et al. |
| 7,656,154 B2 | 2/2010 | Kawabata et al. |
| 7,826,065 B1 | 11/2010 | Okandan et al. |
| 7,872,473 B2 | 1/2011 | Kitching et al. |
| 7,994,783 B2 | 8/2011 | Ledbetter et al. |
| 8,054,074 B2 | 11/2011 | Ichihara et al. |
| 8,212,556 B1 | 7/2012 | Schwindt et al. |
| 8,258,884 B2 | 9/2012 | Borwick, III et al. |
| 8,319,156 B2 | 11/2012 | Borwick, III et al. |
| 8,334,690 B2 | 12/2012 | Kitching et al. |
| 8,373,413 B2 | 2/2013 | Sugioka |
| 8,405,389 B2 | 3/2013 | Sugioka et al. |
| 8,587,304 B2 | 11/2013 | Budker et al. |
| 8,836,327 B2 | 9/2014 | French et al. |
| 8,906,470 B2 | 12/2014 | Overstolz et al. |
| 8,941,377 B2 | 1/2015 | Mizutani et al. |
| 9,084,549 B2 | 7/2015 | Desain et al. |
| 9,095,266 B1 | 8/2015 | Fu |
| 9,116,201 B2 | 8/2015 | Shah et al. |
| 9,140,590 B2 | 9/2015 | Waters et al. |
| 9,140,657 B2 | 9/2015 | Ledbetter et al. |
| 9,169,974 B2 | 10/2015 | Parsa et al. |
| 9,244,137 B2 | 1/2016 | Kobayashi et al. |
| 9,291,508 B1 | 3/2016 | Biedermann et al. |
| 9,343,447 B2 | 3/2016 | Parsa et al. |
| 9,366,735 B2 | 6/2016 | Kawabata et al. |
| 9,383,419 B2 | 7/2016 | Mizutani et al. |
| 9,395,425 B2 | 7/2016 | Diamond et al. |
| 9,417,293 B2 | 8/2016 | Schaffer et al. |
| 9,429,918 B2 | 8/2016 | Parsa et al. |
| 9,568,565 B2 | 2/2017 | Parsa et al. |
| 9,575,144 B2 | 2/2017 | Komack et al. |
| 9,601,225 B2 | 3/2017 | Parsa et al. |
| 9,638,768 B2 | 5/2017 | Foley et al. |
| 9,639,062 B2 | 5/2017 | Dyer et al. |
| 9,677,905 B2 | 6/2017 | Waters et al. |
| 9,726,626 B2 | 8/2017 | Smith et al. |
| 9,726,733 B2 | 8/2017 | Smith et al. |
| 9,791,536 B1 | 10/2017 | Alem et al. |
| 9,829,544 B2 | 11/2017 | Bulatowicz |
| 9,846,054 B2 | 12/2017 | Waters et al. |
| 9,851,418 B2 | 12/2017 | Wolf et al. |
| 9,869,731 B1 | 1/2018 | Hovde et al. |
| 9,915,711 B2 | 3/2018 | Komack et al. |
| 9,927,501 B2 | 3/2018 | Kim et al. |
| 9,948,314 B2 | 4/2018 | Dyer et al. |
| 9,964,609 B2 | 5/2018 | Ichihara et al. |
| 9,964,610 B2 | 5/2018 | Shah et al. |
| 9,970,999 B2 | 5/2018 | Larsen et al. |
| 9,995,800 B1 | 6/2018 | Schwindt et al. |
| 10,024,929 B2 | 7/2018 | Parsa et al. |
| 10,088,535 B1 | 10/2018 | Shah |
| 10,162,016 B2 | 12/2018 | Gabrys et al. |
| 10,194,865 B2 | 2/2019 | Le et al. |
| 10,314,508 B2 | 6/2019 | Desain et al. |
| 10,371,764 B2 | 8/2019 | Morales et al. |
| 10,772,561 B2 | 9/2020 | Donaldson |
| 2004/0232912 A1 | 11/2004 | Tsukamoto et al. |
| 2005/0007118 A1 | 1/2005 | Kitching et al. |
| 2005/0046851 A1 | 3/2005 | Riley, Jr. et al. |
| 2005/0206377 A1 | 9/2005 | Romalis et al. |
| 2007/0076776 A1 | 4/2007 | Lust et al. |
| 2007/0120563 A1 | 5/2007 | Kawabata et al. |
| 2007/0167723 A1 | 7/2007 | Park et al. |
| 2007/0205767 A1 | 9/2007 | Xu et al. |
| 2009/0079426 A1 | 3/2009 | Anderson |
| 2009/0101806 A1 | 4/2009 | Masuda |
| 2009/0141267 A1* | 6/2009 | Hotate ................. G01M 11/335 356/73.1 |
| 2010/0219820 A1 | 9/2010 | Skidmore et al. |
| 2011/0062956 A1 | 3/2011 | Edelstein et al. |
| 2012/0112749 A1 | 5/2012 | Budker et al. |
| 2013/0082700 A1 | 4/2013 | Mizutani et al. |
| 2013/0082701 A1 | 4/2013 | Mizutani et al. |
| 2013/0265042 A1 | 10/2013 | Kawabata et al. |
| 2014/0121491 A1 | 5/2014 | Zhang |
| 2014/0306700 A1 | 10/2014 | Kamada et al. |
| 2014/0354275 A1 | 12/2014 | Sheng et al. |
| 2015/0022200 A1 | 1/2015 | Ichihara et al. |
| 2015/0054504 A1 | 2/2015 | Ichihara et al. |
| 2015/0378316 A1 | 12/2015 | Parsa et al. |
| 2016/0061913 A1 | 3/2016 | Kobayashi et al. |
| 2016/0116553 A1 | 4/2016 | Kim et al. |
| 2016/0223627 A1 | 8/2016 | Shah et al. |
| 2016/0291099 A1* | 10/2016 | Ueno ..................... A61B 5/055 |
| 2016/0313417 A1 | 10/2016 | Kawabata et al. |
| 2017/0023653 A1 | 1/2017 | Kobayashi et al. |
| 2017/0023654 A1 | 1/2017 | Kobayashi et al. |
| 2017/0067969 A1 | 3/2017 | Butters et al. |
| 2017/0199138 A1 | 7/2017 | Parsa et al. |
| 2017/0199251 A1 | 7/2017 | Fujii et al. |
| 2017/0261564 A1 | 9/2017 | Gabrys et al. |
| 2017/0331485 A1 | 11/2017 | Gobet et al. |
| 2017/0343617 A1 | 11/2017 | Manickam et al. |
| 2017/0343695 A1 | 11/2017 | Stetson et al. |
| 2017/0356969 A1 | 12/2017 | Ueno |
| 2017/0360322 A1 | 12/2017 | Ueno |
| 2017/0363695 A1 | 12/2017 | Ueno |
| 2018/0003777 A1 | 1/2018 | Sorenson et al. |
| 2018/0038921 A1 | 2/2018 | Parsa et al. |
| 2018/0100749 A1 | 4/2018 | Waters et al. |
| 2018/0128885 A1 | 5/2018 | Parsa et al. |
| 2018/0156875 A1 | 6/2018 | Herbsommer et al. |
| 2018/0219353 A1 | 8/2018 | Shah |
| 2018/0238974 A1 | 8/2018 | Shah et al. |
| 2018/0313908 A1 | 11/2018 | Knappe et al. |
| 2018/0313913 A1 | 11/2018 | DeNatale et al. |
| 2018/0372813 A1 | 12/2018 | Bulatowicz et al. |
| 2019/0391213 A1 | 12/2019 | Alford |
| 2020/0025844 A1 | 1/2020 | Alford et al. |
| 2020/0057115 A1 | 2/2020 | Jiménez-Martínez et al. |
| 2020/0057116 A1 | 2/2020 | Zorzos et al. |
| 2020/0064421 A1 | 2/2020 | Kobayashi et al. |
| 2020/0072916 A1 | 3/2020 | Alford et al. |
| 2020/0088811 A1 | 3/2020 | Mohseni |
| 2020/0241094 A1 | 7/2020 | Alford |
| 2020/0256929 A1 | 8/2020 | Ledbetter et al. |
| 2020/0309873 A1 | 10/2020 | Ledbetter et al. |
| 2020/0334559 A1 | 10/2020 | Anderson et al. |
| 2020/0341081 A1 | 10/2020 | Mohseni et al. |
| 2020/0381128 A1 | 12/2020 | Pratt et al. |
| 2020/0400763 A1 | 12/2020 | Pratt |
| 2021/0063510 A1 | 3/2021 | Ledbetter |

FOREIGN PATENT DOCUMENTS

| | | |
|---|---|---|
| EP | 2738627 A3 | 6/2014 |
| EP | 2380029 B1 | 10/2015 |
| EP | 3037836 B1 | 9/2017 |
| JP | 2016109665 | 6/2016 |

(56) References Cited

FOREIGN PATENT DOCUMENTS

| JP | 2018004462 | 1/2018 |
|---|---|---|
| WO | 2005/081794 | 9/2005 |
| WO | 2014/031985 | 2/2014 |
| WO | 2017/095998 | 6/2017 |

OTHER PUBLICATIONS

Zetter, R., Iivanainen, J. & Parkkonen, L. Optical Co-registration of MRI and On-scalp MEG. Sci Rep 9, 5490 (2019). https://doi.org/10.1038/s41598-019-41763-4.

Garrido-Jurado, Sergio, Rafael Muñoz-Salinas, Francisco José Madrid-Cuevas and Manuel J. Marin-Jiménez. "Automatic generation and detection of highly reliable fiducial markers under occlusion." Pattern Recognit. 47 (2014): 2280-2292.

Hill RM, Boto E, Rea M, et al. Multi-channel whole-head OPM-MEG: Helmet design and a comparison with a conventional system [published online ahead of print, May 29, 2020]. Neuroimage. 2020;219:116995. doi:10.1016/j.neuroimage.2020.116995.

V. Kazemi and J. Sullivan, "One millisecond face alignment with an ensemble of regression trees," 2014 IEEE Conference on Computer Vision and Pattern Recognition, Columbus, OH, 2014, pp. 1867-1874, doi: 10.1109/CVPR.2014.241.

Holmes, N., Tierney, T.M., Leggett, J. et al. Balanced, bi-planar magnetic field and field gradient coils for field compensation in wearable magnetoencephalography. Sci Rep 9, 14196 (2019).

N. Holmes, J. Leggett, E. Boto, G. Roberts, R.M. Hill, T.M. Tierney, V. Shah, G.R. Barnes, M.J. Brookes, R. Bowtell A bi-planar coil system for nulling background magnetic fields in scalp mounted magnetoencephalography Neuroimage, 181 (2018), pp. 760-774.

J. M. Leger et. al., In-flight performance of the Absolute Scalar Magnetometer vector mode on board the Swarm satellites, Earth, Planets, and Space (2015) 67:57.

Alexandrov, E. B., Balabas, M. V., Kulyasov, V. N., Ivanov, A. E., Pazgalev, A. S., Rasson, J. L., . . . (2004). Three-component variometer based on a scalar potassium sensor. Measurement Science and Technology, 15(5), 918-922.

Gravrand, O., Khokhlov, A., & JL, L. M. (2001). On the calibration of a vectorial 4He pumped magnetometer. Earth, planets and space , 53 (10), 949-958.

Borna, Amir & Carter, Tony & Colombo, Anthony & Jau, Y-Y & McKay, Jim & Weisend, Michael & Taulu, Samu & Stephen, Julia & Schwindt, Peter. (2018). Non-Invasive Functional-Brain-Imaging with a Novel Magnetoencephalography System. 9 Pages.

Vrba J, Robinson SE. Signal processing in magnetoencephalography. Methods. 2001;25(2):249-271. doi:10.1006/meth.2001.1238.

Uusitalo M and Ilmoniemi R., 1997, Signal-space projection method for separating MEG or EEG into components. Med. Biol. Comput. (35) 135-140.

Taulu S and Kajola M., 2005, Presentation of electromagnetic multichannel data: the signal space separation method. J. Appl. Phys. (97) 124905 (2005).

Taulu S, Simola J and Kajola M., 2005, Applications of the signal space separation method. IEEE Trans. Signal Process. (53) 3359-3372 (2005).

Taulu S, Simola J., 2006, Spatiotemporal signal space separation method for rejecting nearby interference in MEG measurements. Phys. Med. Biol. (51) 1759-1768 (2006).

Johnson, et al., Magnetoencephalography with a two-color pump-probe, fiber-coupled atomic magnetometer, Applied Physics Letters 97, 243703 2010.

Zhang, et al., Magnetoencephalography using a compact multichannel atomic magnetometer with pump-probe configuration, AIP Advances 8, 125028 (2018).

Xia, H. & Ben-Amar Baranga, Andrei & Hoffman, D. & Romalis, Michael. (2006). Magnetoencephalography with an atomic magnetometer. Applied Physics Letters—Appl Phys Lett. 89. 10.1063/1.2392722.

Ilmoniemi, R. (2009). The triangle phantom in magnetoencephalography. In 24th Annual Meeting of Japan Biomagnetism and Bioelecctromagnetics Society, Kanazawa, Japan, 28.29.5.2009 {pp. 6263).

Oyama D. Dry phantom for magnetoencephalography—Configuration, calibration, and contribution. J Neurosci Methods. 2015;251:24-36. doi: 0.1016/j.jneumeth.2015.05.004.

Chutani, R., Maurice, V., Passilly, N. et al. Laser light routing in an elongated micromachined vapor cell with diffraction gratings for atomic clock applications. Sci Rep 5, 14001 (2015). https://doi.org/10.1038/srep14001.

Eklund, E. Jesper, Andrei M. Shkel, Svenja Knappe, Elizabeth A. Donley and John Kitching. "Glass-blown spherical microcells for chip-scale atomic devices." (2008).

Jiménez-Martínez R, Kennedy DJ, Rosenbluh M, et al. Optical hyperpolarization and NMR detection of 129Xe on a microfluidic chip. Nat Commun. 2014;5:3908. Published May 20, 2014. doi:10.1038/ncomms4908.

Boto, Elena, Sofie S. Meyer, Vishal Shah, Orang Alem, Svenja Knappe, Peter Kruger, T. Mark Fromhold, et al. "A New Generation of Magnetoencephalography: Room Temperature Measurements Using Optically-Pumped Magnetometers." NeuroImage 149 (Apr. 1, 2017): 404-14.

Bruno, A. C., and P. Costa Ribeiro. "Spatial Fourier Calibration Method for Multichannel SQUID Magnetometers." Review of Scientific Instruments 62, No. 4 (Apr. 1, 1991): 1005-9.

Chella, Federico, Filippo Zappasodi, Laura Marzetti, Stefania Della Penna, and Vittorio Pizzella. "Calibration of a Multichannel MEG System Based on the Signal Space Separation Method." Physics in Medicine and Biology 57 (Jul. 13, 2012): 4855-70.

Pasquarelli, A, M De Melis, Laura Marzetti, Hans-Peter Müller, and S N Emé. "Calibration of a Vector-MEG Helmet System." Neurology & Clinical Neurophysiology: NCN 2004 (Feb. 1, 2004): 94.

Pfeiffer, Christoph, Lau M. Andersen, Daniel Lundqvist, Matti Hämäläinen, Justin F. Schneiderman, and Robert Oostenveld. "Localizing On-Scalp MEG Sensors Using an Array of Magnetic Dipole Coils." PLOS ONE 13, No. 5 (May 10, 2018): e0191111.

Vivaldi, Valentina, Sara Sommariva, and Alberto Sorrentino. "A Simplex Method for the Calibration of a MEG Device." Communications in Applied and Industrial Mathematics 10 (Jan. 1, 2019): 35-46.

Nagel, S., & Spüler, M. (2019). Asynchronous non-invasive high-speed BCI speller with robust non-control state detection. Scientific Reports, 9(1), 8269.

Thielen, J., van den Broek, P., Farquhar, J., & Desain, P. (2015). Broad-Band Visually Evoked Potentials: Re(con)volution in Brain-Computer Interfacing. PloS One, 10(7), e0133797. https://doi.org/10.1371/journal.pone.0133797.

J. Kitching, "Chip-scale atomic devices," Appl. Phys. Rev. 5(3), 031302 (2018), 39 pages.

Allred, J. C., Lyman, R. N., Kornack, T. W., & Romalis, M. V. (2002). High-sensitivity atomic magnetometer unaffected by spin-exchange relaxation. Physical review letters, 89(13), 130801.

Balabas et al. Polarized alkali vapor with minute-long transverse spin-relaxation time, Phys. Rev. Lett. 105, 070801—Published Aug. 12, 2010.

Barbieri, F., Trauchessec, V., Caruso, L., Trejo-Rosillo, J., Telenczuk, B., Paul, E., . . . & Ouanounou, G. (2016). Local recording of biological magnetic fields using Giant Magneto Resistance-based micro-probes. Scientific reports, 6, 39330.

Dmitry Budker and Michael Romalis, "Optical Magnetometry," Nature Physics, 2008, https://arxiv.org/abs/physics/0611246v1.

Anthony P. Colombo, Tony R. Carter, Amir Borna, Yuan-Yu Jau, Cort N. Johnson, Amber L. Dagel, and Peter D. D. Schwindt, "Four-channel optically pumped atomic magnetometer for magnetoencephalography," Opt. Express 24, 15403-15416 (2016).

Dang, H.B. & Maloof, A.C. & Romalis, Michael. (2009). Ultra-high sensitivity magnetic field and magnetization measurements with an atomic magnetometer. Applied Physics Letters. 97. 10.1063/1.3491215.

Donley, E.A. & Hodby, E & Hollberg, L & Kitching, J. (2007). Demonstration of high-performance compact magnetic shields for chip-scale atomic devices. The Review of scientific instruments. 78. 083102.

(56) References Cited

OTHER PUBLICATIONS

Hämäläinen, Matti & Hari, Riitta & Ilmoniemi, Risto J. & Knuutila, Jukka & Lounasmaa, Olli V. Apr. 1993. Magnetoencephalograph—theory, instrumentation, and applications to noninvasive studies of the working human brain. Reviews of Modern Physics. vol. 65, Issue 2. 413-497.

Hunter, D. and Piccolomo, S. and Pritchard, J. D. and Brockie, N. L. and Dyer, T. E. and Riis, E. (2018) Free-induction-decay magnetometer based on a microfabricated Cs vapor cell. Physical Review Applied (10).ISSN 2331-7019.

Jiménez-Martínez, R., Griffith, W. C., Wang, Y. J., Knappe, S., Kitching, J., Smith, K., & Prouty, M. D. (2010). Sensitivity comparison of Mx and frequency-modulated bell-bloom Cs magnetometers in a microfabricated cell. IEEE Transactions on Instrumentation and Measurement, 59(2), 372-378.

Kiwoong Kim, Samo Begus, Hui Xia, Seung-Kyun Lee, Vojko Jazbinsek, Zvonko Trontelj, Michael V. Romalis, Multi-channel atomic magnetometer for magnetoencephalography: A configuration study. NeuroImage 89 (2014) 143-151 http://physics.princeton.edu/romalis/papers/Kim_2014.pdf.

Knappe, Svenja & Sander, Tilmann & Trahms, Lutz. (2012). Optically-Pumped Magnetometers for MEG. Magnetoencephalography: From Signals to Dynamic Cortical Networks. 993-999. 10.1007/978-3-642-33045-2_49.

Kominis, I.K., Komack, T.W., Allred, J.C. and Romalis, M.V., 2003. A subfemtotesla multichannel atomic magnetometer. Nature, 422(6932), p. 596.

Korth, H., K. Strohbehn, F. Tejada, A. G. Andreou, J. Kitching, S. Knappe, S. J. Lehtonen, S. M. London, and M. Kafel (2016), Miniature atomic scalarmagnetometer for space based on the rubidium isotope 87Rb, J. Geophys. Res. Space Physics, 121, 7870-7880, doi:10.1002/2016JA022389.

Lenz, J. and Edelstein, S., 2006. Magnetic sensors and their applications. IEEE Sensors journal, 6(3), pp. 631-649.

Li, S & Vachaspati, Pranjal & Sheng, Dehong & Dural, Nezih & Romalis, Michael. (2011). Optical rotation in excess of 100 rad generated by Rb vapor in a multipass cell. Phys. Rev. A. 84. 10.1103/PhysRevA.84.061403.

Maze, J. R., Stanwix, P. L., Hodges, J. S., Hong, S., Taylor, J. M., Cappellaro, P., . . . & Yacoby, A. (2008). Nanoscale magnetic sensing with an individual electronic spin in diamond. Nature, 455(7213), 644.

Sander TH, Preusser J, Mhaskar R, Kitching J, Trahms L, Knappe S. Magnetoencephalography with a chip-scale atomic magnetometer. Biomed Opt Express. 2012;3(5):981-90.

J. Seltzer, S & Romalis, Michael. (2010). High-temperature alkali vapor cells with antirelaxation surface coatings. Journal of Applied Physics. 106. 114905-114905. 10.1063/1.3236649.

Seltzer, S. J., and Romalis, M.V., "Unshielded three-axis vector operation of a spin-exchange-relaxation-free atomic magnetometer." Applied physics letters 85.20 (2004): 4804-4806.

Sheng, Dong & R. Perry, Abigail & Krzyzewski, Sean & Geller, Shawn & Kitching, John & Knappe, Svenja. (2017). A microfabricated optically-pumped magnetic gradiometer. Applied Physics Letters. 110. 10.1063/1.4974349.

Sheng, Dehong & Li, S & Dural, Nezih & Romalis, Michael. (2013). Subfemtotesla Scalar Atomic Magnetometry Using Multipass Cells. Physical review letters. 110. 160802. 10.1103/PhysRevLett.110.160802.

Volkmar Schultze et al. An Optically Pumped Magnetometer Working in the Light-Shift Dispersed Mz Mode, Sensors 2017, 17, 561; doi:10.3390/s17030561.

Fang, J. and Qin, J., 2012. In situ triaxial magnetic field compensation for the spin-exchange-relaxation-free atomic magnetometer. Review of Scientific Instruments, 83(10), p. 103104.

Joon Lee, Hyun & Shim, Jeong & Moon, Han Seb & Kim, Kiwoong. (2014). Flat-response spin-exchange relaxation free atomic magnetometer under negative feedback. Optics Express. 22. 10.1364/OE.22.019887.

Griffith, Clark & Jimenez-Martinez, Ricardo & Shah, Vishal & Knappe, Svenja & Kitching, John. (2009). Miniature atomic magnetometer integrated with flux concentrators. Applied Physics Letters—Appl Phys Lett. 94. 10.1063/1.3056152.

Lee, S.-K & Romalis, Michael. (2008). Calculation of Magnetic Field Noise from High-Permeability Magnetic Shields and Conducting Objects with Simple Geometry. Journal of Applied Physics. 103. 084904-084904. 10.1063/1.2885711.

Vovrosh, Jamie & Voulazeris, Georgios & Petrov, Plamen & Zou, Ji & Gaber Beshay, Youssef & Benn, Laura & Woolger, David & Attallah, Moataz & Boyer, Vincent & Bongs, Kai & Holynski, Michael. (2018). Additive manufacturing of magnetic shielding and ultra-high vacuum flange for cold atom sensors. Scientific Reports. 8. 10.1038/s41598-018-20352-x.

Kim, Young Jin & Savukov, I. (2016). Ultra-sensitive Magnetic Microscopy with an Optically Pumped Magnetometer. Scientific Reports. 6. 24773. 10.1038/srep24773.

Navau, Carles & Prat-Camps, Jordi & Sanchez, Alvaro. (2012). Magnetic Energy Harvesting and Concentration at a Distance by Transformation Optics. Physical review letters. 109. 263903. 10.1103/PhysRevLett.109.263903.

Orang Alem, Rahul Mhaskar, Ricardo Jiménez-Martínez, Dong Sheng, John LeBlanc, Lutz Trahms, Tilmann Sander, John Kitching, and Svenja Knappe, "Magnetic field imaging with microfabricated optically-pumped magnetometers," Opt. Express 25, 7849-7858 (2017).

Slocum et al., Self-Calibrating Vector Magnetometer for Space, https://esto.nasa.gov/conferences/estc-2002/Papers/B3P4(Slocum).pdf.

Dupont-Roc, J & Haroche, S & Cohen-Tannoudji, C. (1969). Detection of very weak magnetic fields (10-9gauss) by 87Rb zero-field level crossing resonances. Physics Letters A—Phys Lett A. 28. 638-639. 10.1016/0375-9601(69) 90480-0.

J. A. Neuman, P. Wang, and A. Gallagher, Robust high-temperature sapphire cell for metal vapors, Review of Scientific Instruments, vol. 66, Issue 4, Apr. 1995, pp. 3021-3023.

Borna, Amir, et al. "A 20-channel magnetoencephalography system based on optically pumped magnetometers." Physics in Medicine & Biology 62.23 (2017): 8909.

R. E. Slocum & L. J. Ryan, Design and operation of the minature vector laser magnetometer, Nasa Earth Science Technology Conference 2003.

Schoenmaker, Jeroen & R Pirota, K & Teixeira, Julio. (2013). Magnetic flux amplification by Lenz lenses. The Review of scientific instruments. 84. 085120. 10.1063/1.4819234.

Hu, Yanhui & Hu, Zhaohui & Liu, Xuejing & Li, Yang & Zhang, Ji & Yao, Han & Ding, Ming. (2017). Reduction of far off-resonance laser frequency drifts based on the second harmonic of electro-optic modulator detection in the optically pumped magnetometer. Applied Optics. 56. 5927. 10.1364/AO.56.005927.

Masuda, Y & Ino, T & Skoy, Vadim & Jones, G.L. (2005). 3He polarization via optical pumping in a birefringent cell. Applied Physics Letters. 87. 10.1063/1.2008370.

A.B. Baranga et al., An atomic magnetometer for brain activity imaging, Real Time Conference 2005. 14th IEEE-NPSS. pp. 417-418.

Larry J. Ryan, Robert E. Slocum, and Robert B. Steves, Miniature Vector Laser Magnetometer Measurements of Earth's Field, May 10, 2004, 4 pgs.

Lorenz, V. O., Dai, X., Green, H., Asnicar, T. R., & Cundiff, S. T. (2008). High-density, high-temperature alkali vapor cell. Review of Scientific Instruments, 79(12), 4 pages.

F. Jackson Kimball, D & Dudley, J & Li, Y & Thulasi, Swecha & Pustelny, Szymon & Budker, Dmitry & Zolotorev, Max. (2016). Magnetic shielding and exotic spin-dependent interactions. Physical Review D. 94. 10.1103/PhysRevD.94.082005.

Huang, Haichao, et al. "Single-beam three-axis atomic magnetometer." Applied Physics Letters 109.6 (2016): 062404. (Year: 2016).

Scott Jeffrey Seltzer: "Developments in alkali-metal atomic magnetometry", Nov. 1, 2008 (Nov. 1, 2008), XP055616618, ISBN: 978-0-549-93355-7 Retrieved from the Internet: URL:http://physics.princeton.edu/atomic/romalis/papers/Seltzer%20Thesis.pdf [retrieved on Aug. 29, 2019] pp. 148-159.

(56) References Cited

OTHER PUBLICATIONS

Haifeng Dong et al: "Atomic-Signal-Based Zero-Field Finding Technique for Unshielded Atomic Vector Magnetometer", IEEE Sensors Journal, IEEE Service Center, New York, NY, US, vol. 13, No. 1, Jan. 1, 2013 (Jan. 1, 2013), pp. 186-189.
Boto, E, Holmes, N, Leggett, J, Roberts, G, Shah, V, Meyer, SS, Muñoz, LD, Mullinger, KJ, Tierney, TM, Bestmann, S, Barnes, GR, Bowtell, R & Brookes, MJ 2018, 'Moving magnetoencephalography towards real world applications with a wearable system', Nature, vol. 555, pp. 657-661.
Ijsselsteijn, R & Kielpinski, Mark & Woetzel, S & Scholtes, Theo & Kessler, Ernst & Stolz, Ronny & Schultze, V & Meyer, H-G. (2012). A full optically operated magnetometer array: An experimental study. The Review of scientific instruments. 83. 113106. 10.1063/1.4766961.
Tierney, T. M., Holmes, N., Meyer, S. S., Boto, E., Roberts, G., Leggett, J., . . . Barnes, G. R. (2018). Cognitive neuroscience using wearable magnetometer arrays: Non-invasive assessment of language function. NeuroImage, 181, 513-520.
Manon Kok, Jeroen D. Hol and Thomas B. Schon (2017), "Using Inertial Sensors for Position and Orientation Estimation", Foundations and Trends in Signal Processing: vol. 11: No. 1-2, pp. 1-153. http://dx.doi.org/10.1561/2000000094.
Okada, Y.C., Lahteenmäki, A. and Xu, C., "Experimental analysis of distortion of magnetoencephalography signals by the skull." Clinical neurophysiology 110 (2), 230-238 (1999).
Robinson, J.T., Pohlmeyer, E., Gather, M.C., Kemere, C., Kitching, J.E., Malliaras, G.G., Marblestone, A., Shepard, K. L., Stieglitz, T. and Xie, C., "Developing Next-Generation Brain Sensing Technologies—A Review." IEEE sensors Journal, 19(22), 10163-10175 (2019).
Shah, V., Knappe, S., Schwindt, P.D. and Kitching, J., "Subpicotesla atomic magnetometry with a microfabricated vapour cell." Nature Photon 1, 649-652 (2007).
Griffith, W.C., Knappe, S. and Kitching, J., "Femtotesla atomic magnetometry in a microfabricated vapor cell." Optics express 18, (26), 27167-27172 (2010).
Tierney, T.M., Holmes, N., Mellor, S., López, J.D., Roberts, G., Hill, R.M., Boto, E., Leggett, J., Shah, V., Brookes, M.J. and Bowtell, R., "Optically pumped magnetometers: From quantum origins to multichannel magnetoencephalography." NeuroImage, 199, 598-608 (2019).
Iivanainen, J., Zetter, R., Grön, M., Hakkarainen, K. and Parkkonen, L., "On-scalp MEG system utilizing an actively shielded array of optically-pumped magnetometers." Neuroimage 194, 244-258 (2019).
Iivanainen, J., Stenroos, M. and Parkkonen, L., "Measuring MEG closer to the brain: Performance of on-scalp sensor arrays." NeuroImage 147, 542-553 (2017).
Kitching, J., Knappe, S., Gerginov, V., Shah, V., Schwindt, P.D., Lindseth, B., Donley E.A., "Chip-scale atomic devices: precision atomic instruments based on MEMS." In Frequency Standards And Metrology, 445-453 (2009).
Kitching, J., Knappe, S. and Donley, E.A., "Atomic sensors—a review." IEEE Sensors Journal, 11(9), 1749-1758 (2011).
Budker, D. and Romalis, M., "Optical magnetometry". Nature physics, 3(4), 227-234 (2007).
Happer, W., "Optical pumping", Rev. Mod. Phys., 44 (2), 169-249 (1972).
Purcell, E.M., Field, G.B., "Influence of collisions upon population of hyperfine states in hydrogen", Astrophys. J., 124, 542 (1956).
Ledbetter, M.P., Savukov, I.M., Acosta, V.M., Budker, D. and Romalis, M.V., "Spin-exchange-relaxation-free magnetometry with Cs vapor." Physical Review A, 77(3), 033408 (2008).
Bloom, A. L., "Principles of operation of the rubidium vapor magnetometer." Applied Optics 1(1), 61-68 (1962).
Bell, W.E., and Bloom, A.L., "Optically driven spin precession." Physical Review Letters 6, (6), 280 (1961).
Roberts, G., Holmes, N., Alexander, N., Boto, E., Leggett, J., Hill, R.M., Shah, V., Rea, M., Vaughan, R., Maguire, E.A. and Kessler, K., "Towards OPM-MEG in a virtual reality environment." NeuroImage, 199, 408-417 (2019).
Zhang, R., Xiao, W., Ding, Y., Feng, Y., Peng, X., Shen, L., Sun, C., Wu, T., Wu, Y., Yang, Y. and Zheng, Z., "Recording brain activities in unshielded Earth's field with optically pumped atomic magnetometers." Science Advances, 6(24) (2020).
De Cheveigné, A., Wong, D.D., Di Liberto, G.M., Hjortkjaer, J., Slaney, M. and Lalor, E., "Decoding the auditory brain with canonical component analysis." NeuroImage, 172, 206-216 (2018).
Mellinger, J., Schalk, G., Braun, C., Preissl, H., Rosenstiel, W., Birbaumer, N. and Kübler, A., "An MEG-based brain-computer interface (BCI)." Neuroimage, 36(3), 581-593 (2007).
Wolpaw, J.R., McFarland, D.J., Neat, G.W. and Forneris, C.A., "An EEG-based brain-computer interface for cursor control." Electroencephalography and clinical neurophysiology, 78(3), 252-259 (1991).
Lightfoot, G., "Summary of the N1-P2 cortical auditory evoked potential to estimate the auditory threshold in adults". Seminars in hearing, 37(1), 1 (2016).
Virtanen, J., Ahveninen, J., Ilmoniemi, R. J., Näätänen, R., & Pekkonen, E., "Replicability of MEG and EEG measures of the auditory N1/N1m-response." Electroencephalography and Clinical Neurophysiology/Evoked Potentials Section, 108(3), 291-298 (1998).
Gascoyne, L., Furlong, P. L., Hillebrand, A., Worthen, S. F., & Witton, C., "Localising the auditory N1m with event-related beamformers: localisation accuracy following bilateral and unilateral stimulation." Scientific reports, 6(1), 1-9 (2016).
Borna, A., Carter, T.R., Goldberg, J.D., Colombo, A.P., Jau, Y.Y., Berry, C., McKay, J., Stephen, J., Weisend, M. and Schwindt, P.D., "A 20-channel magnetoencephalography system based on optically pumped magnetometers." Physics in Medicine & Biology, 62(23), 8909 (2017).
Pyragius, T., Marin Florez, H., & Fernholz, T. (2019). A Voigt effect based 3D vector magnetometer. Physical Review A, 100(2), https://doi.org/10.1103/PhysRevA.100.023416.
Rui Zhang, Rahul Mhaskar, Ken Smith, Easswar Balasubramaniam, Mark Prouty. "All Optical Scalar Atomic Magnetometer Capable of Vector Measurement," Submitted on Nov. 17, 2020. https://arxiv.org/abs/2011.08943; Geometrics, Inc., San Jose, CA, 95131, USA.
Arjen Stolk, Ana Todorovic, Jan-Mathijs Schoffelen, and Robert Oostenveld. "Online and offline tools for head movement compensation in MEG." Neuroimage 68 (2013): 39-48.
Bagherzadeh, Yasaman, Daniel Baldauf, Dimitrios Pantazis, and Robert Desimone. "Alpha synchrony and the neurofeedback control of spatial attention." Neuron 105, No. 3 (2020): 577-587.

* cited by examiner

| Beam Polarization | | Beam Location |
|---|---|---|
| Pump | Probe | |
| ↗ | ↔ | VCSEL to QWP |
| ↻ | ↔ | QWP to Vapor Cell |
| ↻ | ↙ | Vapor Cell to QWP |
| ↘ | ⊙ | QWP to Prism |
| ⊙ | | Prism to Detector Branch 1 (374b') |
| ⊙ | | Prism to Detector Branch 2 (374b") |
| ↘ | | Prism to Detector (374a) |

COMPACT OPTICALLY PUMPED MAGNETOMETERS WITH PUMP AND PROBE CONFIGURATION AND SYSTEMS AND METHODS

CROSS-REFERENCE TO RELATED APPLICATIONS

This application claims the benefit of U.S. Provisional Patent Application Serial Nos. 62/837,587, filed Apr. 23, 2019, and 62/860,001, filed Jun. 11, 2019, both of which are incorporated herein by reference in their entireties.

FIELD

The present disclosure is directed to the area of optically pumped magnetometers (OPMs) and magnetic field measurement systems using an array of OPMs. The present disclosure is also directed to OPMs using a pump/probe configuration and systems and methods that employ the OPMs.

BACKGROUND

In the nervous system, neurons propagate signals via action potentials. These are brief electric currents which flow down the length of a neuron causing chemical transmitters to be released at a synapse. The time-varying electrical currents within an ensemble of neurons generates a magnetic field. Magnetoencephalography (MEG), the measurement of magnetic fields generated by the brain, is one method for observing these neural signals.

Existing systems for observing or measuring MEG typically utilize superconducting quantum interference devices (SQUIDs) or collections of discrete optically pumped magnetometers (OPMs). SQUIDs require cryogenic cooling which is bulky and expensive and requires a lot of maintenance which preclude their use in mobile or wearable devices. Many conventional applications of optically pumped magnetometers to MEG involve a single vapor cell inside a 1 to 2 cm package, preventing or hindering spatial resolution beyond this range. Thermal management and magnetic cross talk also pose other practical limitations to achieving high spatial resolution with discrete magnetometers.

BRIEF SUMMARY

One embodiment is an optically pumped magnetometer that includes a vapor cell; at least one light source configured to produce a pump light beam and a probe light beam; a lens disposed between the at least one light source and the vapor cell; a quarter wave plate disposed between the lens and the vapor cell; a mirror configured to receive the pump light beam and probe light beam after passing through the vapor cell and reflect the pump light beam and probe light beam back through the vapor cell, the quarter wave plate, and the lens; and at least one detector configured to receive the probe light beam reflected by the mirror.

In at least some embodiments, the optically pumped magnetometer further includes a substrate upon which the at least one light source and the at least one detector are disposed.

In at least some embodiments, the at least one light source and the at least one detector are disposed in a first focal plane of the lens. In at least some embodiments, the mirror is disposed in a second focal plane of the lens.

In at least some embodiments, the at least one light source includes a pump light source configured to produce the pump light beam and a probe light source configured to produce the probe light beam. In at least some embodiments, the pump light source and the probe light source are identical.

In at least some embodiments, the at least one light source is a single light source configured to synchronously produce the pump light beam and the probe light beam. In at least some embodiments, the pump light beam includes a first pump light beam and a second pump light beam and the at least one light source includes a first light source configured to produce the first pump light beam and a second light source configured to synchronously produce the second pump light beam and the probe light beam.

In at least some embodiments, the at least one detector includes a first detector and a second detector. In at least some embodiments, the optically pumped magnetometer further includes a polarization analyzer configured to split the probe light beam reflected by the mirror into a first beam having a first polarization and a second beam having a second polarization, wherein the second detector is a balanced detector including a first detector component configured to receive the first beam and a second detector component configured to receive the second beam.

Another embodiment is a magnetic field measurement system that includes at least one of the optically pumped magnetometers described above and a processor configured to direct production of the pump light beam and the probe light beam and to receive signals from the at least one detector.

In at least some embodiments, the at least one light source includes a pump light source configured to produce the pump light beam and a probe light source configured to produce the probe light beam, where the pump light source and the probe light source are identical, where the processor is configured to direct operation of the pump light source to produce the pump light beam at a first wavelength and to direct operation of the probe light source to produce the probe light beam at a second wavelength that is different from the first wavelength.

In at least some embodiments, the at least one light source is a single light source, where the processor is configured to direct tuning of the single light source to a first wavelength to produce the pump light beam and to subsequently direct detuning of the single light source to a second wavelength to produce the probe light beam.

In at least some embodiments, the at least one light source includes a first light source and a second light source, where the processor is configured to direct tuning of the first and second light sources to a first wavelength to produce the pump light beam and to subsequently direct detuning of the second light source to a second wavelength to produce the probe light beam.

In at least some embodiments, the optically pumped magnetometer further includes a polarization analyzer configured to split the probe light beam reflected by the mirror into a first beam having a first polarization and a second beam having a second polarization, where the at least one detector includes a first detector and a second detector and the second detector is a balanced detector including a first detector component configured to receive the first beam and a second detector component configured to receive the second beam.

In at least some embodiments, the processor is configured to either 1) subtract a signal of the first detector component from a signal of the second detector component or 2) receive a signal that is a difference between the signal from the first detector component and the signal from the second detector component.

Yet another embodiment is a method of measuring a magnetic field that includes providing any of the optically pumped magnetometers described above; illuminating the vapor cell arrangement using the pump light beam produced by the at least one light source; subsequently illuminating the vapor cell arrangement using the probe light beam produced by the at least one light source; in response to the illuminating using the probe light beam, receiving signals from the detectors; and measuring the magnetic field using the signals.

In at least some embodiments, the at least one light source of the optically pumped magnetometer includes a pump light source configured to produce the pump light beam at a first wavelength and a probe light source configured to produce the probe light beam at a second wavelength that is different from the first wavelength, where the pump light source and the probe light source are identical.

In at least some embodiments, the at least one light source of the optically pumped magnetometer is a single light source, where illuminating the vapor cell arrangement using the pump light beam includes tuning the single light source to a first wavelength to produce the pump light beam and subsequently illuminating the vapor cell arrangement includes detuning the single light source to a second wavelength to produce the probe light beam.

In at least some embodiments, the at least one light source of the optically pumped magnetometer includes a first light source and a second light source, where illuminating the vapor cell arrangement using the pump light beam includes tuning the first and second light sources to a first wavelength to produce the pump light beam and subsequently illuminating the vapor cell arrangement includes detuning the second light source to a second wavelength to produce the probe light beam.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

Figure 1A:
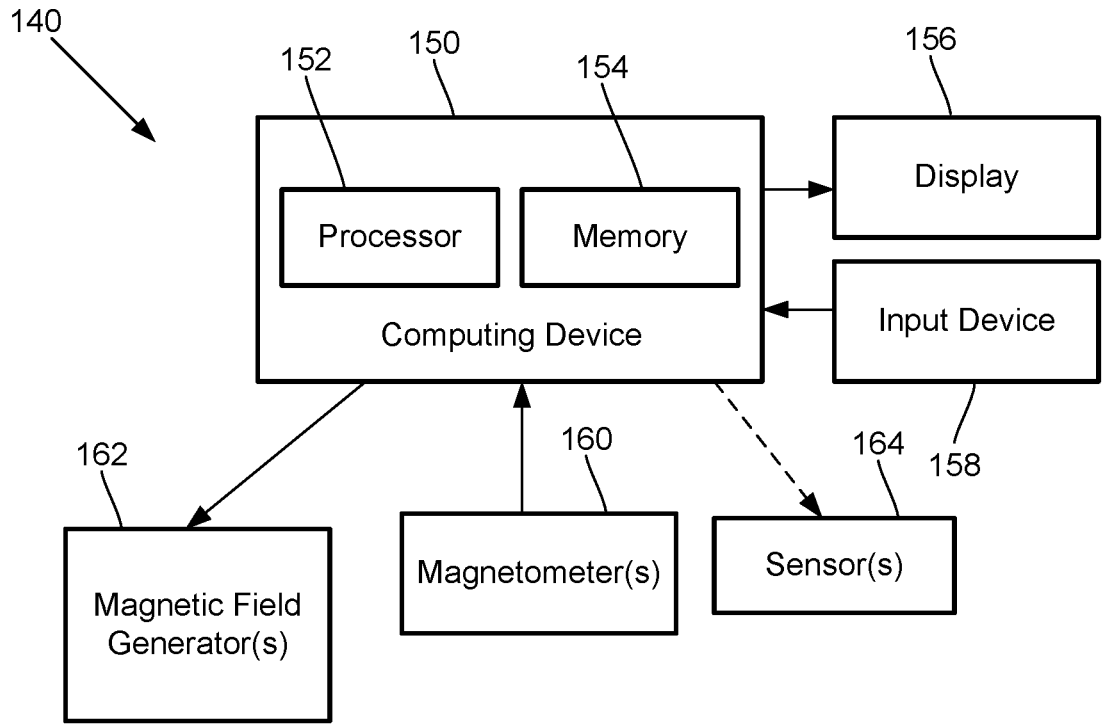
FIG. 1A is a schematic block diagram of one embodiment of a magnetic field measurement system, according to the invention.

The present disclosure is directed to the area of optically pumped magnetometers (OPMs) and magnetic field measurement systems using an array of OPMs. The present disclosure is also directed to OPMs using a pump/probe configuration and systems and methods that employ the OPMs. Although the present disclosure utilizes magnetoencephalography (MEG) to exemplify the OPMs, systems, and methods described herein, it will be understood that the OPMs, systems, and methods can be used in any other suitable application.

Herein the terms "ambient background magnetic field" and "background magnetic field" are interchangeable and used to identify the magnetic field or fields associated with sources other than the magnetic field measurement system and the biological source(s) (for example, neural signals from a user's brain) or other source(s) of interest. The terms can include, for example, the Earth's magnetic field, as well as magnetic fields from magnets, electromagnets, electrical devices, and other signal or field generators in the environment, except for the magnetic field generator(s) that are part of the magnetic field measurement system.

The terms "gas cell", "vapor cell", and "vapor gas cell" are used interchangeably herein. Below, a gas cell containing alkali metal vapor is described, but it will be recognized that other gas cells can contain different gases or vapors for operation.

An optically pumped magnetometer (OPM) is a basic component used in optical magnetometry to measure magnetic fields. While there are many types of OPMs, in general magnetometers operate in two modalities: vector mode and scalar mode. In vector mode, the OPM can measure one, two, or all three vector components of the magnetic field; while in scalar mode the OPM can measure the total magnitude of the magnetic field.

Vector mode magnetometers measure a specific component of the magnetic field, such as the radial and tangential components of magnetic fields with respect the scalp of the human head. Vector mode OPMs often operate at zero-field and may utilize a spin exchange relaxation free (SERF) mode to reach femto-Tesla sensitivities. A SERF mode OPM is one example of a vector mode OPM, but other vector mode OPMs can be used at higher magnetic fields. These SERF mode magnetometers can have high sensitivity but may not function in the presence of magnetic fields higher than the linewidth of the magnetic resonance of the atoms of about 10 nT, which is much smaller than the magnetic field strength generated by the Earth. As a result, conventional SERF mode magnetometers often operate inside magnetically shielded rooms that isolate the sensor from ambient magnetic fields including Earth's magnetic field.

Magnetometers operating in the scalar mode can measure the total magnitude of the magnetic field. (Magnetometers in the vector mode can also be used for magnitude measurements.) Scalar mode OPMs often have lower sensitivity than SERF mode OPMs and are capable of operating in higher magnetic field environments.

The magnetic field measurement systems described herein can be used to measure or observe electromagnetic signals generated by one or more sources (for example, neural signals or other biological sources). The system can measure biologically generated magnetic fields and, at least in some embodiments, can measure biologically generated magnetic fields in an unshielded or partially shielded environment. Aspects of a magnetic field measurement system will be exemplified below using magnetic signals from the brain of a user; however, biological signals from other areas of the body, as well as non-biological signals, can be measured using the system. In at least some embodiments, the system can be a wearable MEG system that can be used outside a magnetically shielded room. Examples of wearable MEG systems are described in U.S. Non-Provisional patent application Ser. No. 16/457,655 which is incorporated herein by reference in its entirety.

FIG. 1A is a block diagram of components of one embodiment of a magnetic field measurement system 140. The system 140 can include a computing device 150 or any other similar device that includes a processor 152 and a memory 154, a display 156, an input device 158, one or more magnetometers 160 (for example, an array of magnetometers) which can be OPMs, one or more magnetic field generators 162, and, optionally, one or more sensors 164. The system 140 and its use and operation will be described herein with respect to the measurement of neural signals arising from signal sources in the brain of a user as an example. It will be understood, however, that the system can be adapted and used to measure other neural signals, other biological signals, as well as non-biological signals.

The computing device 150 can be a computer, tablet, mobile device, field programmable gate array (FPGA), microcontroller, or any other suitable device for processing information or instructions. The computing device 150 can be local to the user or can include components that are non-local to the user including one or both of the processor 152 or memory 154 (or portions thereof). For example, in at least some embodiments, the user may operate a terminal that is connected to a non-local computing device. In other embodiments, the memory 154 can be non-local to the user.

The computing device 150 can utilize any suitable processor 152 including one or more hardware processors that may be local to the user or non-local to the user or other components of the computing device. The processor 152 is configured to execute instructions.

Any suitable memory 154 can be used for the computing device 150. The memory 154 illustrates a type of computer-readable media, namely computer-readable storage media. Computer-readable storage media may include, but is not limited to, volatile, nonvolatile, non-transitory, removable, and non-removable media implemented in any method or technology for storage of information, such as computer readable instructions, data structures, program modules, or other data. Examples of computer-readable storage media include RAM, ROM, EEPROM, flash memory, or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

Communication methods provide another type of computer readable media; namely communication media. Communication media typically embodies computer-readable instructions, data structures, program modules, or other data in a modulated data signal such as a carrier wave, data signal, or other transport mechanism and include any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

The display 156 can be any suitable display device, such as a monitor, screen, or the like, and can include a printer. In some embodiments, the display is optional. In some embodiments, the display 156 may be integrated into a single unit with the computing device 150, such as a tablet, smart phone, or smart watch. In at least some embodiments, the display is not local to the user. The input device 158 can be, for example, a keyboard, mouse, touch screen, track ball, joystick, voice recognition system, or any combination thereof, or the like. In at least some embodiments, the input device is not local to the user.

The magnetic field generator(s) 162 can be, for example, Helmholtz coils, solenoid coils, planar coils, saddle coils, electromagnets, permanent magnets, or any other suitable arrangement for generating a magnetic field. As an example, the magnetic field generator 162 can include three orthogonal sets of coils to generate magnetic fields along three orthogonal axes. Other coil arrangement can also be used. The optional sensor(s) 164 can include, but are not limited to, one or more magnetic field sensors, position sensors, orientation sensors, accelerometers, image recorders, or the like or any combination thereof.

The one or more magnetometers 160 can be any suitable magnetometer including, but not limited to, any suitable optically pumped magnetometer. Arrays of magnetometers are described in more detail herein. In at least some embodiments, at least one of the one or more magnetometers (or all of the magnetometers) of the system is arranged for operation in the SERF mode. Examples of magnetic field measurement systems or methods of making such systems or components for such systems are described in U.S. Patent Application Publications Nos. 2020/0072916; 2020/0056263; 2020/0025844; 2020-0057116; 2019/0391213; 2020/0088811; and 2020/0057115; U.S. patent application Ser. Nos. 16/573,394; 16/573,524; 16/679,048; 16/741,593; and 16/752,393, and U.S. Provisional Patent Application Serial Nos. 62/689,696; 62/699,596; 62/719,471; 62/719,475; 62/719,928; 62/723,933; 62/732,327; 62/732,791; 62/741,777; 62/743,343; 62/747,924; 62/745,144; 62/752,067; 62/776,895; 62/781,418; 62/796,958; 62/798,209; 62/798,330; 62/804,539; 62/826,045; 62/827,390; 62/836,421; 62/837,574; 62/837,587; 62/842,818; 62/855,820; 62/858,636; 62/860,001; 62/865,049; 62/873,694; 62/874,887; 62/883,399; 62/883,406; 62/888,858; 62/895,197; 62/896,929; 62/898,461; 62/910,248; 62/913,000; 62/926,032; 62/926,043; 62/933,085; 62/960,548; 62/971,132; and 62/983,406, all of which are incorporated herein by reference in their entireties.

In a single-beam OPM, optical pumping and probing of atomic spins are implemented continually using a single light source. In comparison to these single-beam OPMs, independent pump-probe OPMs, which utilize a pump light source and a separate probe light source, can have advantages and additional capabilities. For instance, a pump-probe OPM enables independent control and improvement or enhancement of the optical pumping and probing processes which in turn can provide and increase the benefits of optical rotation probing. The pump-probe technique has enabled the most sensitive OPMs to date. However, conventional configurations for independent pump-probe OMPs can be difficult to implement in a compact portable package. One conventional arrangement is a perpendicular pump-probe device where the pump light beam and probe light beam are perpendicular to each other. The pump light polarizes the atoms and then the atomic polarization evolves in the magnetic field. The resultant state of the atoms' polarization is detected by measuring transmission or polarization rotation of the subsequent probe light. Optical properties (for example, power, polarization, and detuning) of the pump beam and the probe beam can be independently manipulated to enhance operation of the process.

Figure 1B:
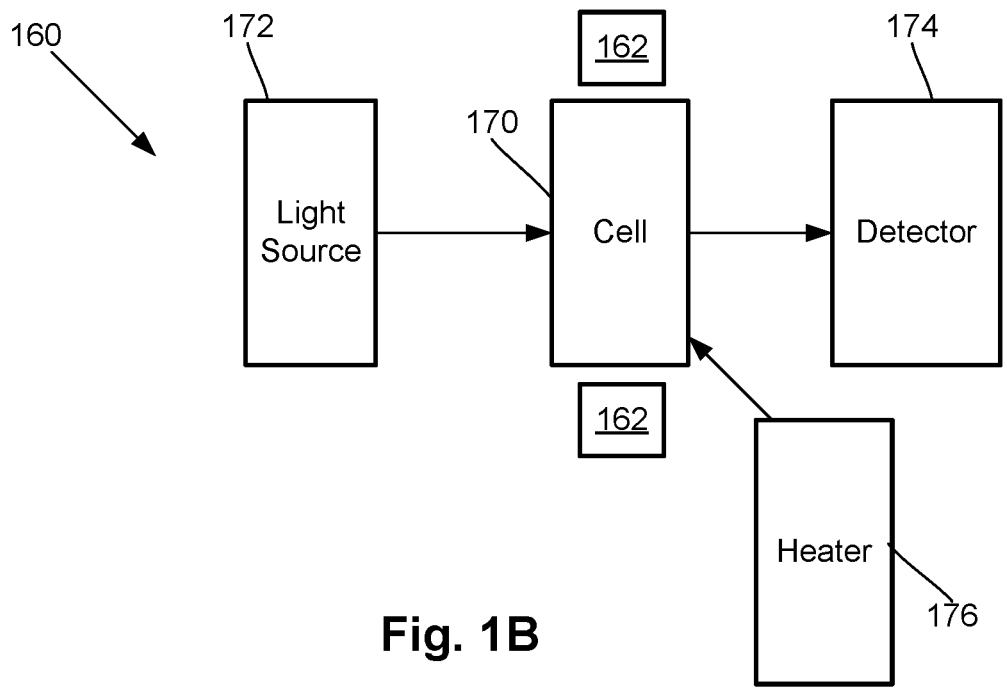
FIG. 1B is a schematic block diagram of one embodiment of a magnetometer, according to the invention.

FIG. 1B is a schematic block diagram of one embodiment of a magnetometer 160 which includes a vapor cell 170 (also referred to as a "cell" or "vapor cell") such as an alkali metal vapor cell; a heating device 176 to heat the cell 170; a pump light source 172a; a probe light source 172b; and a detector 174. In addition, coils of a magnetic field generator 162 can be positioned around the vapor cell 170. The vapor cell 170 can include, for example, an alkali metal vapor (for example, rubidium in natural abundance, isotopically enriched rubidium, potassium, or cesium, or any other suitable alkali metal such as lithium, sodium, or francium) and, optionally, one, or both, of a quenching gas (for example, nitrogen) and a buffer gas (for example, nitrogen, helium, neon, or argon). In some embodiments, the vapor cell may include the alkali metal atoms in a prevaporized form prior to heating to generate the vapor.

The pump and probe light sources 172a, 172b can each include, for example, a laser to, respectively, optically pump the alkali metal atoms and probe the vapor cell. The pump and probe light sources 172a, 172b may also include optics (such as lenses, waveplates, collimators, polarizers, and objects with reflective surfaces) for beam shaping and polarization control and for directing the light from the light source to the cell and detector. Examples of suitable light sources include, but are not limited to, a diode laser (such as a vertical-cavity surface-emitting laser (VCSEL), distributed Bragg reflector laser (DBR), or distributed feedback laser (DFB)), light-emitting diode (LED), lamp, or any other suitable light source.

The detector 174 can include, for example, an optical detector to measure the optical properties of the transmitted probe light field amplitude, phase, or polarization, as quantified through optical absorption and dispersion curves, spectrum, or polarization or the like or any combination thereof. Examples of suitable detectors include, but are not limited to, a photodiode, charge coupled device (CCD) array, CMOS array, camera, photodiode array, single photon avalanche diode (SPAD) array, avalanche photodiode (APD) array, or any other suitable optical sensor array that can measure the change in transmitted light at the optical wavelengths of interest.

Figure 2:
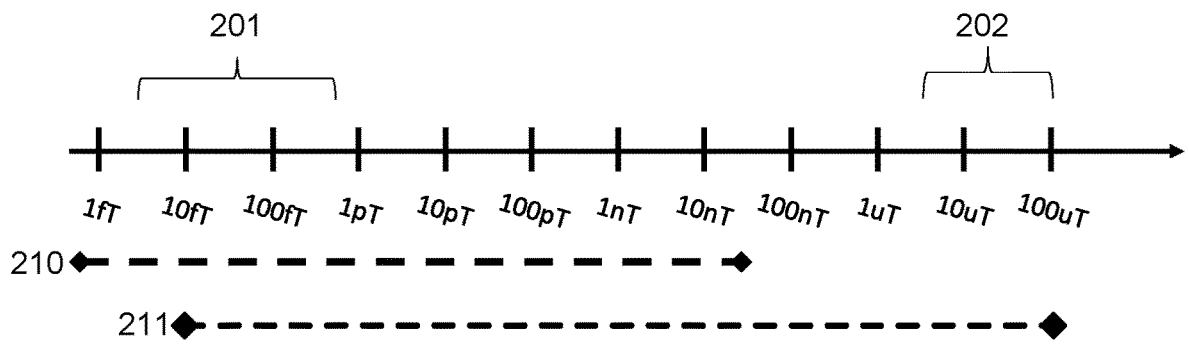
FIG. 2 shows a magnetic spectrum with lines indicating dynamic ranges of magnetometers operating in different modes.

FIG. 2 shows the magnetic spectrum from 1 fT to 100 µT in magnetic field strength on a logarithmic scale. The magnitude of magnetic fields generated by the human brain are indicated by range 201 and the magnitude of the background ambient magnetic field, including the Earth's magnetic field, by range 202. The strength of the Earth's magnetic field covers a range as it depends on the position on the Earth as well as the materials of the surrounding environment where the magnetic field is measured. Range 210 indicates the approximate measurement range of a magnetometer (e.g., an OPM) operating in the SERF mode (e.g., a SERF magnetometer) and range 211 indicates the approximate measurement range of a magnetometer operating in a scalar mode (e.g., a scalar magnetometer.) Typically, a SERF magnetometer is more sensitive than a scalar magnetometer but many conventional SERF magnetometers typically only operate up to about 0 to 200 nT while the scalar magnetometer starts in the 10 to 100 fT range but extends above 10 to 100 µT.

In at least some embodiments, the OPMs disclosed herein are compact OPMs. In at least some embodiments, a compact, portable OPM design, as described herein, which utilizes the pump-probe method can have one or more desirable properties. In at least some embodiments, all of the optical components are disposed on a single side of the vapor cell, allowing the magnetic sensing element (e.g., the vapor cell) to be placed closer to the surface of the OPM and the magnetic source. In at least some embodiments, the pump and probe beam isolation is based on spatial filtering, which compared with the commonly used spectral or angular (k-space) filtering, can enable a more compact design. In at least some embodiments, the pump and probe polarization preparation can be performed within a single set of optics, which may enable a more compact design and ease of manufacturing. In at least some embodiments, identical light sources (for example, lasers) or detectors (for example, photodiodes) can be used which may increase the ease of control and manufacturability. Regarding this latter property, unlike the "two-color" approach of many conventional pump-probe OPM arrangements (where the pump light source and probe light source have substantially different wavelengths and, therefore, are typically different substantially different light sources), in at least some embodiments, the relatively close proximity of the wavelengths of the pump and probe light sources can allow using other optical elements (for example, lenses, quarter wave plates, mirrors, or the like) that are designed for light (e.g., wavelengths) from both light sources.

Figure 3A:
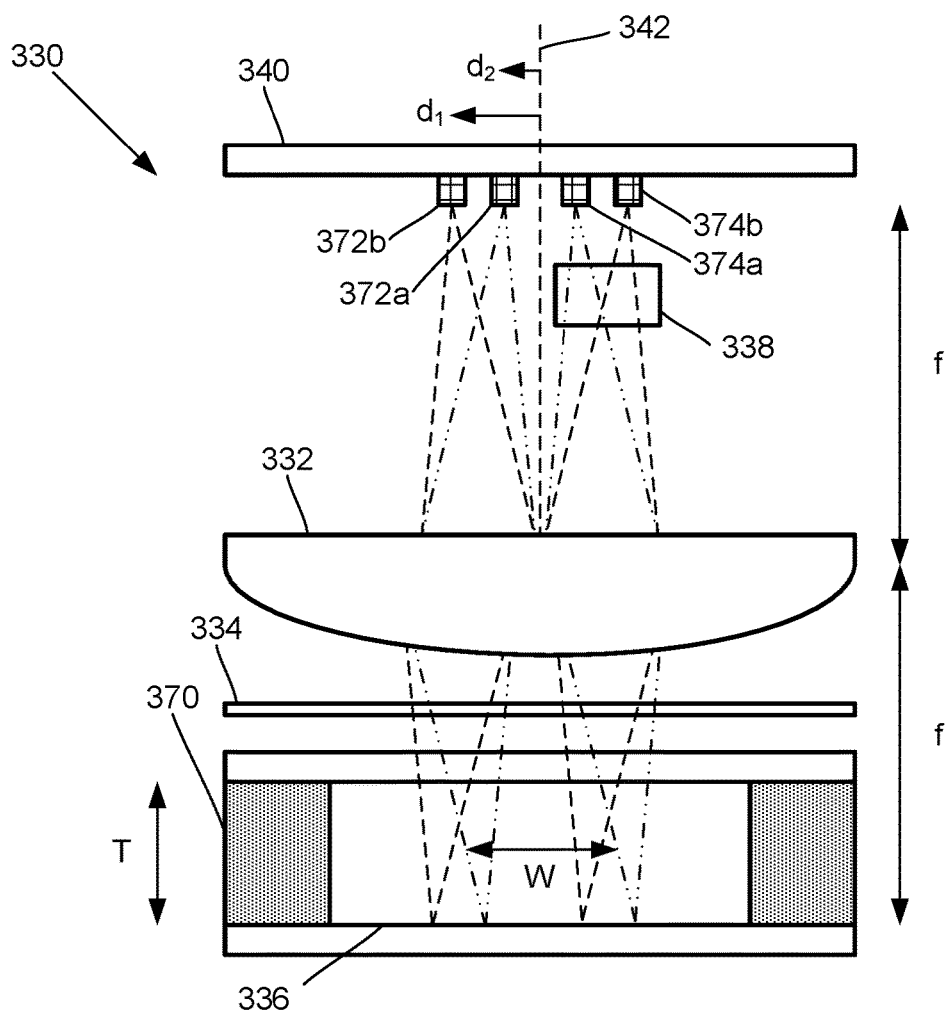
FIGS. 3A and 3B are, respectively, a side view and a top plan view of one embodiment of an optically pumped magnetometer, according to the invention.
Figures 3B, 4:
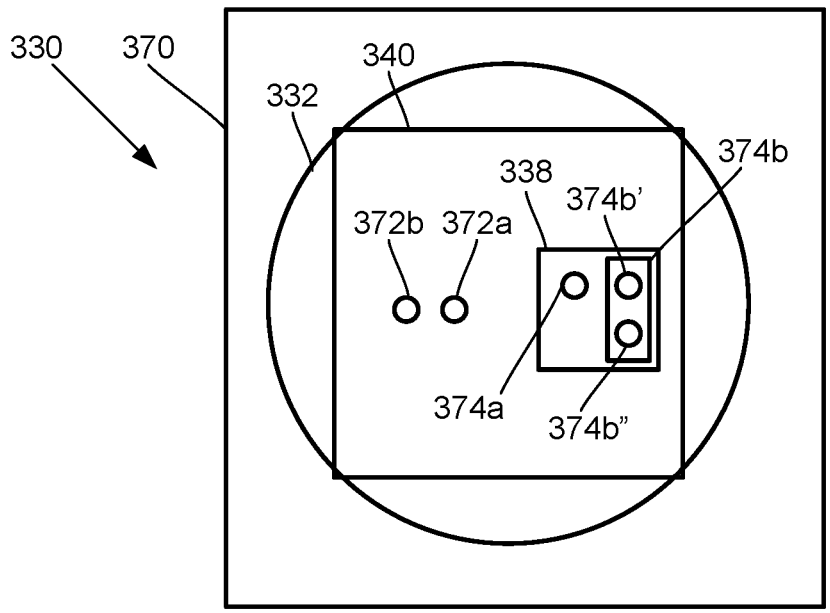
FIG. 4 is a chart of pump and probe beam polarizations at different points in the optically pumped magnetometer of FIGS. 3A and 3B, according to the invention.

FIG. 3A is a side view of one embodiment of a compact pump-probe OPM arrangement 330. FIG. 3B is a top plan view of the OPM arrangement 330 (with the components of the arrangement being transparent for illustration purposes). The OPM arrangement 330 includes a pump light source 372a, a probe light source 372b, a lens 332, a quarter-wave plate 334, a vapor cell 370, a mirror 336, a polarization analyzer 338, a first detector 374a, and a second detector 374b. The pump light source 372a, probe light source 372b, first detector 374a, and second detector 374b are coupled to a processor (such as processor 152 of FIG. 1A or any other suitable processor or processors) to direct operation and to receive signals from the detectors 374a, 374b. It will be understood that a magnetic field generator 162 (FIG. 1) can be provided around or adjacent to the OPM arrangement 330.

The pump light source 372a and probe light source 372b can be vertical cavity surface emitting lasers (VCSELs), although any other suitable light source, such as, for example, a light-emitting diode (LED), an organic light-emitting diode (OLED), or any other suitable type of laser, can be used. In at least some embodiments, the pump and probe light sources 372a, 372b can be disposed (or even manufactured) on the same substrate 340.

In at least some embodiments, the pump and probe light sources 372a, 372b are identical VCSELs (or other suitable lasers), but are electrically powered differently to achieve a difference in wavelength. As one example, at least some embodiments of an optically pumped magnetometer (OPM) with a rubidium vapor cell can operate using a frequency difference between the pump and probe light sources 372a, 372b that is in the few to hundreds of GHz (for example, the frequency difference can be in the range of 1 to 500 GHz or in the range of 10 to 100 GHz). In at least some embodiments, this frequency difference can be generated by a relatively small difference in the laser current of, for example, a few tens to hundreds of micro-Ampere between the two identical VCSELs. As one example of operation, the pump light source 372a is tuned to resonate with the rubidium absorption frequency, while the probe light source 372b is detuned to the side of the peak absorption of rubidium. As described in more detail below, VCSELs produce polarized light. In at least some embodiments, the pump or probe light sources do not produce polarized light and so one or more polarizers is incorporated in the arrangement 330 to polarize the light emitted by one, or both, of the pump or probe light sources.

In the illustrated embodiment, both the pump and probe light sources 372a, 372b are disposed on the focal surface of a lens 332 with focal length (f), which expands the emitted near-Gaussian beams to a desired diameter (W). In the illustrated embodiments, the lens 332 is a planoconvex lens. The beams of the pump and probe light sources 372a, 372b are co-propagating, but have a small difference in the angle of the main axis of the beam depending on the distances of the pump light source 372a (distance $d_1$) and the probe light source 372b (distance $d_2$) from the optical axis 342 of the lens 332. The angle difference is approximately equal to $\arctan(d_1/f) - \arctan(d_2/f)$. In at least some embodiments, the overlap of the two beams from the pump and probe light sources 372a, 372b may be relatively large. The fraction of the two beams from the pump and probe light sources 372a, 372b that does not overlap with in the vapor cell 370 is approximately equal to:

$$\frac{\left(1 + \frac{T}{2f}\right)(d_1 - d_2)}{\pi\left(\frac{W}{2}\right)}$$

where T is the thickness of the vapor cell 370. As an example, for W=2 mm, T=3 mm, f=5 mm, and $d_1 - d_2$=200 μm, the percentage of the two beams of the pump and probe light sources 372a, 372b that do not overlap is about 5.4% and, therefore, there is about 94% overlap of the two beams for the example dimensions.

Between the lens 332 and the vapor cell 370, there is a quarter waveplate 334 (QWP). In at least some embodiments, the pump and probe light sources 372a, 372b (for example, VCSELs) produce polarized light and positioned such that the polarization of one of the pump beam is at 45 degrees relative to the QWP axis so that the QWP converts the linear polarization to circular polarization, as illustrated in FIG. 4. The probe beam has a polarization parallel to the QWP main axis and passes through the QWP unaffected, as illustrated in FIG. 4. (In another embodiment, the probe beam can have the 45 degree polarization with the pump beam having polarization parallel to the QWP main axis so that the pump and probe beams will exchange places in FIG. 4.) Thus, in at least some embodiments of the OPM arrangements, the pump and probe polarization preparation is performed within a single optical element (e.g., quarter waveplate 334) which may enable a compact design and ease of manufacturing of OPMs.

The wavelength of the pump beam is at, or near, resonance for the alkali metal atoms in the vapor cell 370 and polarizes the alkali metal atoms in the vapor cell 370 along the pump beam's propagation direction. The probe beam is detuned from the resonance frequency of the alkali metal atoms, and depending on the magnitude and direction of the external magnetic field (for example, the magnetic field that is of interest), the probe beam experiences a polarization rotation (q) as it goes through the cell twice due to back-reflection by the mirror 336. The mirror 336 may be disposed within the vapor cell 370, as illustrated in FIG. 3A, or outside of the vapor cell 370. The mirror 336 (or reflector) is preferably positioned exactly at distance (f) from the lens so that the two beams refocus to different spots on the lens focal plane (since this is a folded 4f system).

Both the pump and probe beams, after returning from the vapor cell 370, pass through the QWP 334 and the lens 332 again with corresponding changes in polarization illustrated in FIG. 4. In particular, the second pass through the QWP 334 returns the pump beam to linear polarization, but changes the polarization of the probe beam to elliptical polarization depending on the polarization rotation arising from the magnetic field experienced by the alkali metal atoms in the vapor cell 370.

A polarization analyzer 338 (for example, a Wollaston prism (WP)) is positioned between the lens 332 and the detectors 374a, 374b to split the probe beam into two components with orthogonal polarizations, as illustrated in FIG. 4. In at least some embodiments, the splitting axis of the polarization analyzer 338 is at a 45 degree angle with respect to the reflected probe beam, leading to splitting of the probe beam into two beams of approximately equal intensity when there is no magnetic field in the vapor cell 370. The splitting means that the probe beam will focus at two spots on the focal plane. A paired-photodetector 374b (for example, a balanced detector) is positioned at these locations with two detectors 374b', 374b", as illustrated in FIG. 3B.

The outputs of the detector pair 374b', 374b" can be compared or otherwise utilized to determine or estimate the magnitude of the magnetic field within the vapor cell 370. For example, in at least some embodiments, the outputs of the detector pair 374b', 374b" are subtracted from each other to generate the electrical signal (i.e. photocurrent) sent to the processor. In the absence of an external magnetic field, equal power from the probe beam reaches both detectors 374b', 374b", leading to a near-zero electrical signal. A small magnetic field (perpendicular to the pump beam propagation direction) produces a polarization rotation that breaks the symmetry and leads to a positive or negative net current from the detector pair 374b', 374b". In at least some embodiments, one advantage of this balanced detection can be suppression of the laser intensity fluctuation—and reduction of the so-called relative intensity noise (RIN). The phase-shift measurements, arising from optical rotation of the probe beam after pumping by the pump beam, are often superior to absorption measurements by single-beam OPMs.

In at least some embodiments of the OPM arrangements, as illustrated in FIGS. 3A and 3B, pump and probe beam isolation is based on spatial filtering (as compared to the commonly used spectral, or angular(k-space) filtering in conventional arrangement) enabling a compact device. Conventionally, separation of the pump beam from the probe beam has been either wavelength-based or direction-based. Wavelength separation uses a filter that scales in size with $(1/\lambda_1-1/\lambda_2)^{-1}$, where $\lambda_1$ and $\lambda_2$ are the wavelengths of each of the lasers. This approach requires a large separation of the wavelength to achieve a compact filter (resulting in a two-color OPM) which adds to the complexity of the system as the two lasers will typically be substantially different. Another common filtering method is based on different propagation direction of the two beams—crossing inside the cell. However, this method may also introduce complexity of manufacturing and heat management in a compact OPM.

Figure 5:
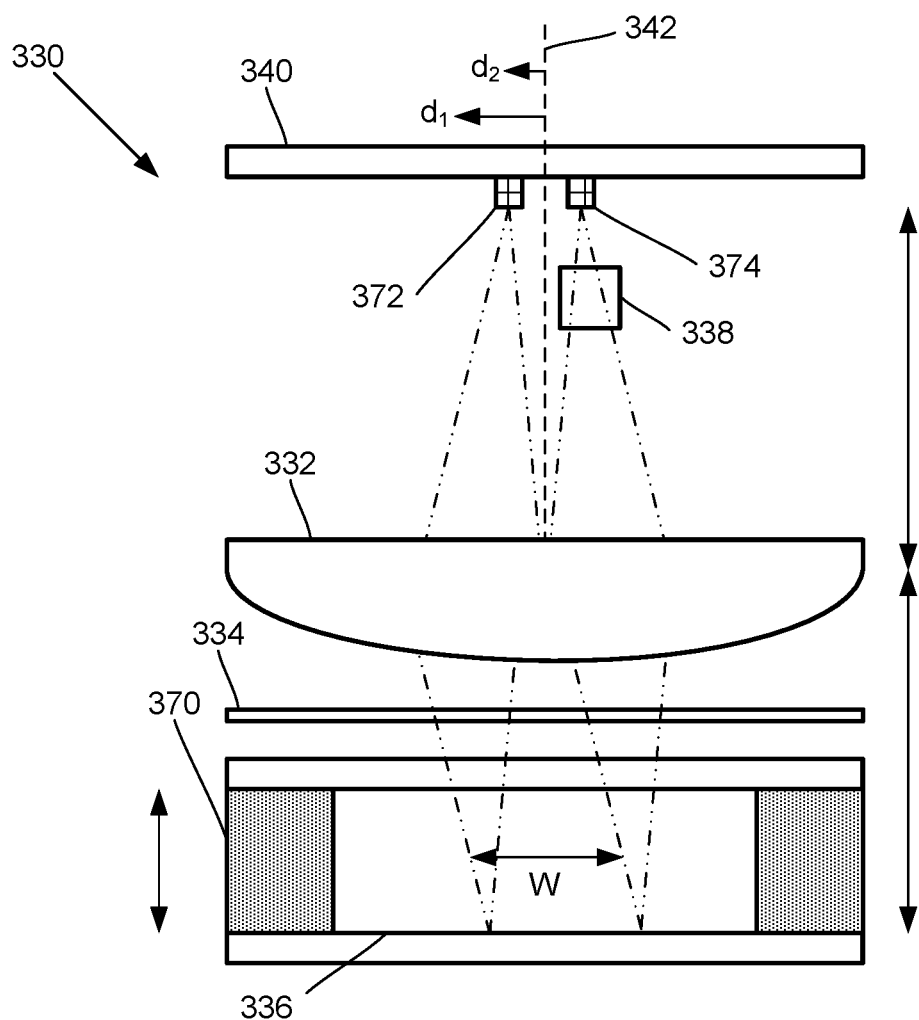
FIG. 5 is a side view of another embodiment of an optically pumped magnetometer, according to the invention.

FIG. 5 illustrates another embodiment of an OPM arrangement 330 that differs from the embodiment illustrated in FIG. 3 in the use of a single light source 372 and single detector 374 (which may be a detector pair similar to detector pair 374b', 374b" in FIG. 3B). The other components are the same as described above. The light source 372 and detector 374 are coupled to a processor (such as processor 152 of FIG. 1A or any other suitable processor or processors) to direct operation and to receive signals from the detector 374. It will be understood that a magnetic field generator 162 (FIG. 1) can be provided around or adjacent to the OPM arrangement 330.

Figure 6:
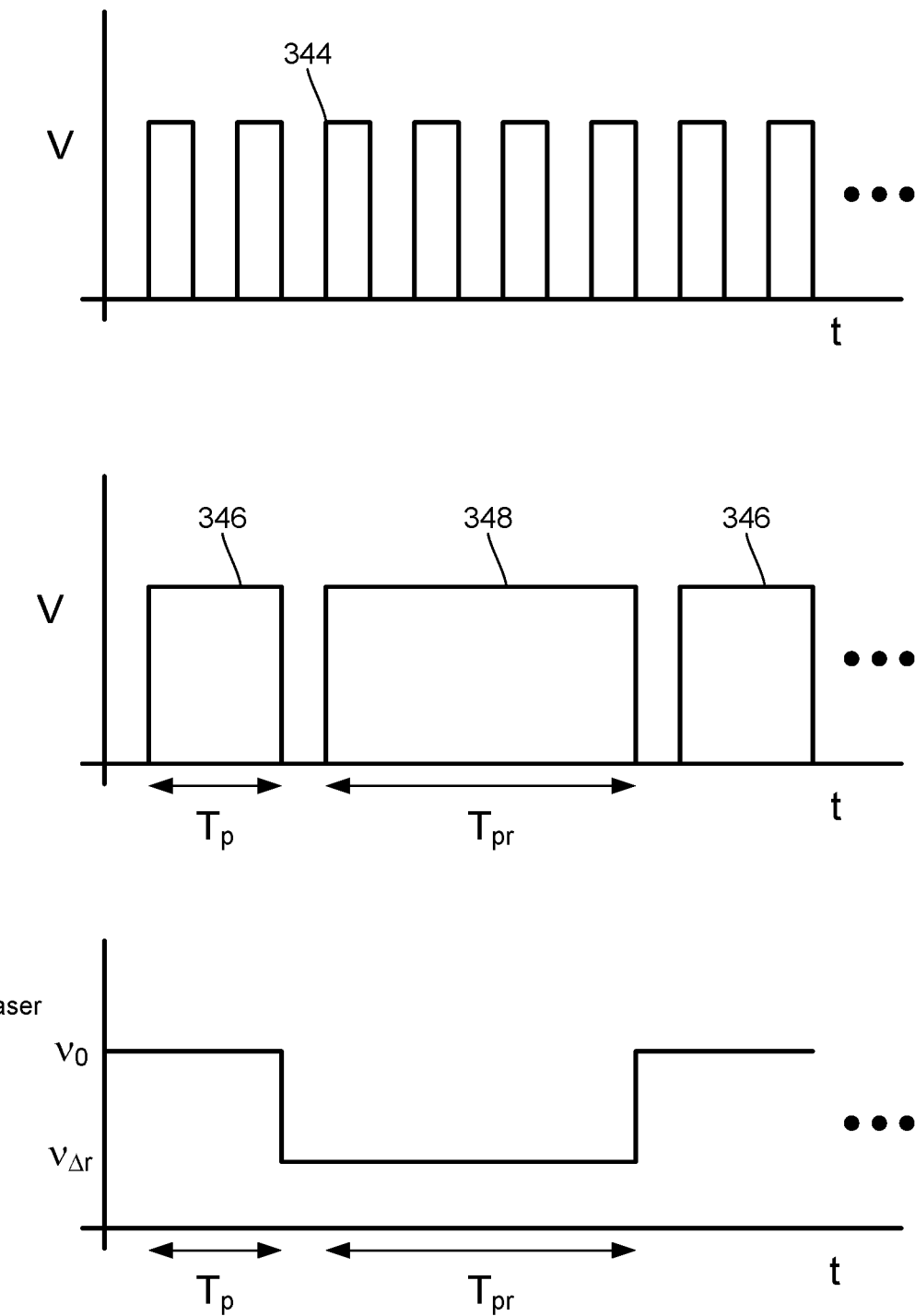
FIG. 6 illustrates graphs of 1) a clock signal, 2) pump and probe periods, and 3) light source emission frequency for one embodiment of the optically pumped magnetometer of FIG. 5, according to the invention.

The OPM arrangement 330 illustrated in FIG. 5 utilizes synchronous pumping and probing from a single light source 372 which can be, for example, a laser such as a VCSEL. As an example of operation, when the OPM arrangement 330 is turned on, light from the light source 372 is detuned and elliptically polarized. A clock signal 344 (top graph of voltage versus time in FIG. 6) drives pump duty cycles 346 and probe duty cycles 348 (middle graph of voltage versus time of FIG. 6). During the pump duty cycles 346, the optical frequency of the light emitted by the light source 372 is moved close to, or at, resonance ($v_0$) of the alkali metal atoms in the vapor cell 370, as illustrated in the bottom graph of frequency verses time in FIG. 6, and the light source emits high optical power. The light source 372 produces a pump beam for a time interval Tp, which, in at least some embodiments, can be set comparable to the decoherence time T2 of the alkali metal atoms in the vapor cell 370. (T2 is a known feature of alkali metal response.) In at least some embodiments, under these conditions T2 is very short due to power broadening of the on-resonance high optical power pump beam. Then the optical frequency is moved back to off-resonance ($v_{\Delta r}$—FIG. 6) and a probe beam is emitted from the light source 372 during a time interval Tpr which, in at least some embodiments, can be set equal to, or greater than, T2. In at least some embodiments, T2, under these conditions, can be very long as the light exerts negligible power broadening on the alkali metal atoms. The recorded photocurrent at the detector 374 can be binned according to the corresponding pump duty cycle 346 or probe duty cycle 348 using the clock signal 344 to focus on the probe duty cycles.

Figure 7:
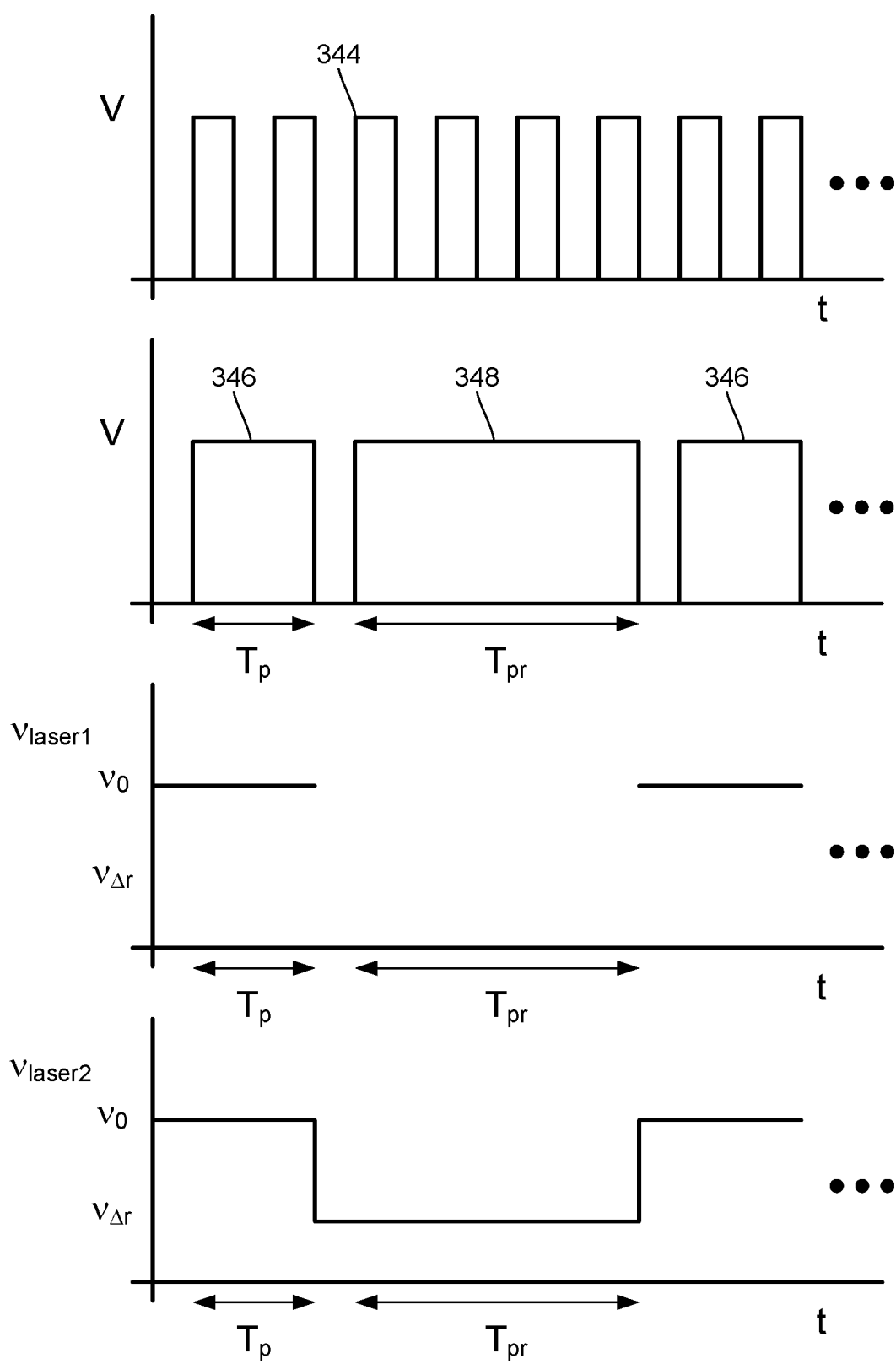
FIG. 7 illustrates graphs of 1) a clock signal, 2) pump and probe periods, 3) emission frequency for a first light source of one embodiment of the optically pumped magnetometer of FIGS. 3A and 3B, and 4) emission frequency for a second light source of one embodiment of the optically pumped magnetometer of FIGS. 3A and 3B, according to the invention.

A further embodiment utilizes the OPM arrangement 330 illustrated in FIG. 3 except that light sources 372a, 372b both provide pump beams and light source 372b also provides the probe beam. This OPM arrangement 330 provides asynchronous pumping and probing with the two light sources 372a, 372b (for example, lasers such as VCSELs). FIG. 7 illustrates graphs of the clock signal 344 (top graph), pump duty cycles 346 and probe duty cycles 348 (second graph), and frequency versus time for the two light sources 372a, 372b (bottom two graphs which exemplify the light sources as lasers.) In at least some embodiments, the two light sources 372a, 372b output H and V linearly polarized light respectively and the beams from the two light sources overlap at the vapor cell 370. In at least some embodiments, the two light sources 372a, 372b may be phase locked.

As an example of operation, to pump the alkali metal vapor in the vapor cell 370, both light sources 372a, 372b are tuned on resonance of the alkali metal atoms in the vapor cell 370, as illustrated in the bottom two graphs of FIG. 7. Pumping occurs for Tp (which may be approximately equal to T2, where T2 may be relatively short due to power broadening and represents spin-spin relaxation or the decay of transverse magnetization.) Then light source 372a is switched off and light source 372b is detuned to generate the probe beam during Tpr (which may be approximately equal to T2), as illustrated in the bottom two graphs of FIG. 7. In at least some embodiments, during probing T2 may be relatively long as there is little or no power broadening and far detuned light. The recorded photocurrent at the detectors 374a, 374b can be binned according to the corresponding pump or probe duty cycle using the clock signal to focus on the probe duty cycles.

In at least some embodiments including any of the embodiments described above, to maintain the balance point of the detector 374b (which may be a polarimeter or balanced detector as illustrated in FIG. 3B) a calibration process can be used periodically. In the calibration process, the probe light source (for example, light source 372b in FIG. 3 or light source 372 in FIG. 5) is detuned by many optical linewidths from the resonance frequency of the alkali metal atoms in the vapor cell 370 so that the optical rotation of the probe beam is not magnetically sensitive. The relative gains of the pair of detectors 374b', 374b" can be electronically adjusted to achieve DC balance of their photocurrents. Alternatively or additionally, the demodulated AC optical rotation signal can also be measured after lock-in. Although that signal should be zero (because the probe is magnetically insensitive), it may have some nonzero component and that may provide a calibration offset. After the calibration procedure, the detuning of the probe light source can be slewed back to its operating point and the magnetometer can continue operation. The dynamic range will not be limited by this effect, rather by the dynamic range of the field nulling servo when operating.

In at least some embodiments, this calibration procedure is performed only frequently enough to overcome slow drifts and, in at least some embodiments with VCSEL light sources, can be accomplished fairly rapidly because VCSEL detuning can slew quickly, after which the response only needs a few more lock-in time constants to settle.

The illustrated embodiments have one vapor cell 370, but it will be recognized that the OPM arrangement 330 of each of the embodiments can be repeated in one, two, or three dimensions to form an array of OPM arrangements which may be connected together or separated from each other. For example, an array of connected OPM arrangements may include an array of connector vapor cells 370 and a substrate 340 that includes an array of light sources 372a, 372b, 372 and an array of detectors 374a, 374b, 374.

In at least some embodiments of the OPM arrangements 330, all optical components are on a single plane and a single side of the vapor cell 370, as illustrated in FIGS. 3A and 5. In at least some embodiments, the magnetic sensing zone (i.e., the vapor cell 370) can be positioned close to the surface of the physical package containing the OPM so that the OPM can be placed close to the source of the magnetic field that is to be detected. Such an arrangement can be beneficial as the magnetic field rapidly drops with distance. In at least some embodiments of the OPM arrangements 330, the light sources 372a, 372b, 372, detectors 374a, 374b, 374, and associated electronics can be positioned relatively far from the vapor cell 370, which is typically heated above 120° C. In at least some embodiments of the OPM arrangements 330, the light sources 372a, 372b, 372, detectors 374a, 374b, 374, and associated electronics can be placed on a single surface or substrate 340, such as a printed circuit board (PCB), ceramic substrate, glass substrate, or plastic substrate which may significantly increase the yield for manufacturing and may all these components to be placed or manufactured by automated tools.

Thus, in at least some embodiments of the OPM arrangements, the use of VCSELs enables dynamic operation of device and implementation of sophisticated methods such as asynchronous pumping-probing.

The above specification provides a description of the invention and its manufacture and use. Since many embodiments of the invention can be made without departing from the spirit and scope of the invention, the invention also resides in the claims hereinafter appended.

What is claimed as new and desired to be protected by Letters Patent of the United States is:

1. An optically pumped magnetometer, comprising:
    a vapor cell;
    at least one light source configured to produce a pump light beam and a probe light beam;
    a lens disposed between the at least one light source and the vapor cell and configured to receive both the pump light beam and the probe light beam;
    a quarter wave plate disposed between the lens and the vapor cell;
    a mirror configured to receive the pump light beam and the probe light beam after passing through the vapor cell and reflect the pump light beam and the probe light beam back through the vapor cell, the quarter wave plate, and the lens; and
    at least one detector configured to receive the probe light beam reflected by the mirror, wherein the at least one light source and the at least one detector are disposed in a first focal plane of the lens.

2. The optically pumped magnetometer of claim 1, further comprising a single substrate upon which the at least one light source and the at least one detector are disposed.

3. The optically pumped magnetometer of claim 1, wherein the mirror is disposed in a second focal plane of the lens.

4. The optically pumped magnetometer of claim 1, wherein the at least one light source comprises a pump light source configured to produce the pump light beam and a probe light source configured to produce the probe light beam.

5. The optically pumped magnetometer of claim 4, wherein the pump light source and the probe light source are identical.

6. The optically pumped magnetometer of claim 1, wherein the at least one light source is a single light source configured to produce the pump light beam and the probe light beam.

7. The optically pumped magnetometer of claim 1, wherein the pump light beam comprises a first pump light beam and a second pump light beam and the at least one light source comprises a first light source configured to produce the first pump light beam and a second light source configured to produce the second pump light beam and to produce the probe light beam.

8. The optically pumped magnetometer of claim 1, wherein the at least one detector comprises a first detector and a second detector.

9. A magnetic field measurement system, comprising
    at least one optically pumped magnetometer of claim 1; and
    a processor configured to direct production of the pump light beam and the probe light beam and to receive signals from the at least one detector.

10. The magnetic field measurement system of claim 9, wherein the at least one light source comprises a pump light source configured to produce the pump light beam and a probe light source configured to produce the probe light beam, wherein the pump light source and the probe light source are identical, wherein the processor is configured to direct operation of the pump light source to produce the pump light beam at a first wavelength and to direct operation of the probe light source to produce the probe light beam at a second wavelength that is different from the first wavelength.

11. The magnetic field measurement system of claim 9, wherein the at least one light source comprises a first light source and a second light source, wherein the processor is configured to direct tuning of the first and second light sources to a first wavelength to produce the pump light beam and to subsequently direct detuning of the second light source to a second wavelength to produce the probe light beam.

12. The magnetic field measurement system of claim 9, wherein each of the at least one optically pumped magnetometer further comprises a polarization analyzer configured to split the probe light beam reflected by the mirror into a first beam having a first polarization and a second beam having a second polarization, wherein the at least one detector comprises a first detector and a second detector and the second detector is a balanced detector comprising a first detector component configured to receive the first beam and a second detector component configured to receive the second beam.

13. The magnetic field measurement system of claim 12, wherein the processor is configured to either 1) subtract a signal of the first detector component from a signal of the second detector component or 2) receive a signal that is a difference between the signal from the first detector component and the signal from the second detector component.

14. A method of measuring a magnetic field, the method comprising:
    providing the optically pumped magnetometer of claim 1;
    illuminating the vapor cell using the pump light beam produced by the at least one light source;
    subsequently illuminating the vapor cell using the probe light beam produced by the at least one light source;
    in response to the illuminating using the probe light beam, receiving signals from the at least one detector; and
    measuring the magnetic field using the signals.

15. The method of claim 14, wherein the at least one light source of the optically pumped magnetometer comprises a pump light source configured to produce the pump light beam at a first wavelength and a probe light source configured to produce the probe light beam at a second wavelength that is different from the first wavelength, wherein the pump light source and the probe light source are identical.

16. The method of claim 14, wherein the at least one light source of the optically pumped magnetometer is a single light source,
    wherein illuminating the vapor cell using the pump light beam comprises tuning the single light source to a first wavelength to produce the pump light beam, and subsequently illuminating the vapor cell comprises detuning the single light source to a second wavelength to produce the probe light beam.

17. The method of claim 14, wherein the at least one light source of the optically pumped magnetometer comprises a first light source and a second light source, wherein illuminating the vapor cell using the pump light beam comprises tuning the first and second light sources to a first wavelength to produce the pump light beam, and subsequently illuminating the vapor cell comprises detuning the second light source to a second wavelength to produce the probe light beam.

18. An optically pumped magnetometer, comprising:
a vapor cell;
at least one light source configured to produce a pump light beam and a probe light beam;
a lens disposed between the at least one light source and the vapor cell;
a quarter wave plate disposed between the lens and the vapor cell;
a mirror configured to receive the pump light beam and the probe light beam after passing through the vapor cell and reflect the pump light beam and the probe light beam back through the vapor cell, the quarter wave plate, and the lens;
a polarization analyzer configured to split at least a portion of the probe light beam reflected by the mirror into a first beam having a first polarization and a second beam having a second polarization; and
a balanced detector comprising a first detector component configured to receive the first beam and a second detector component configured to receive the second beam.

19. A magnetic field measurement system comprising:
an optically pumped magnetometer, comprising
a vapor cell,
a single light source configured to produce a pump light beam and a probe light beam,
a lens disposed between the single light source and the vapor cell and configured to receive both the pump light beam and the probe light beam,
a quarter wave plate disposed between the lens and the vapor cell,
a mirror configured to receive the pump light beam and the probe light beam after passing through the vapor cell and reflect the pump light beam and the probe light beam back through the vapor cell, the quarter wave plate, and the lens, and
at least one detector configured to receive the probe light beam reflected by the mirror; and
a processor configured to direct production of the pump light beam and the probe light beam and to receive signals from the at least one detector, wherein the processor is configured to direct tuning of the single light source to a first wavelength to produce the pump light beam and to subsequently direct detuning of the single light source to a second wavelength to produce the probe light beam.

20. The magnetic field measurement system of claim 19, wherein the single light source and the at least one detector are disposed in a first focal plane of the lens.

* * * * *